United States Patent
Banno

(10) Patent No.: US 7,408,368 B2
(45) Date of Patent: Aug. 5, 2008

(54) SEMICONDUCTOR INTEGRATED CIRCUIT DEVICE HAVING PADS RESPECTIVELY PROVIDED WITH PAD PORTIONS

(75) Inventor: Moriyasu Banno, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/619,824

(22) Filed: Jan. 4, 2007

(65) Prior Publication Data
US 2007/0159203 A1 Jul. 12, 2007

(30) Foreign Application Priority Data
Jan. 11, 2006 (JP) .............................. 2006-003437

(51) Int. Cl.
*G01R 31/02* (2006.01)
(52) U.S. Cl. ..................................... 324/763
(58) Field of Classification Search ................. 324/763, 324/754, 757
See application file for complete search history.

(56) References Cited

U.S. PATENT DOCUMENTS

| | | | | |
|---|---|---|---|---|
| 5,506,499 A | * | 4/1996 | Puar | 324/158.1 |
| 5,554,940 A | | 9/1996 | Hubacher | |
| 6,002,267 A | * | 12/1999 | Malhotra et al. | 324/765 |
| 6,288,346 B1 | * | 9/2001 | Ojiri et al. | 174/260 |
| 6,721,920 B2 | * | 4/2004 | Rearick et al. | 714/815 |
| 6,731,128 B2 | * | 5/2004 | Das et al. | 324/765 |

FOREIGN PATENT DOCUMENTS

JP 8-29451 2/1996

* cited by examiner

*Primary Examiner*—Ha Nguyen
*Assistant Examiner*—Karen M Kusumakar
(74) *Attorney, Agent, or Firm*—Oblon, Spivak, McClelland, Maier & Neustadt, P.C.

(57) ABSTRACT

A semiconductor device is provided with test-subject circuit 1, test-irrelevant circuit 2, first pads used for the test-subject circuit, and second pads used for the test-irrelevant circuit. The first pads include a plurality of divided pad portions while each of the second pads is provided with a single pad portion.

10 Claims, 6 Drawing Sheets

SEMICONDUCTOR INTEGRATED CIRCUIT DEVICE HAVING PADS RESPECTIVELY PROVIDED WITH PAD PORTIONS

CROSS-REFERENCE OF RELATED APPLICATIONS

This application is based upon and claims the benefit of priority from the prior Japanese Patent Application No. 2006-003437, filed on Jan. 11, 2006, the entire contents of which are incorporated herein by reference.

FIELD OF THE INVENTION

This invention generally relates to a semiconductor device that is subjected to a plurality of operation and/or characteristic tests in its manufacturing process.

BACKGROUND OF THE INVENTION

As recent technological progress in a large-scale integrated circuit (LSI) device has been advanced, a system LSI device such as a system on a chip (SoC) and a microcomputer containing a plurality of circuits, such as processor cores, memories and interface logics, in a single semiconductor chip has been widespread.

LSI devices under manufacture are tested in wafer and package stages to judge whether their operations and/or characteristics are satisfactory or not. In such operation and/or characteristic tests, a semiconductor tester applies test pattern inputs to one or more circuits and checks whether output results are correct or not. Here, the output results means the ones provided from the circuits operated in response to input test patterns. When the test of the LSI devices is carried out in the wafer stage, the test patterns are applied to, and output results are provided from, pins of a probe card kept in contact with their corresponding pads of the LSI devices. The pads are directly or indirectly connected with the circuits in the LSI device.

As LSI devices become larger in scale, test processes become more complicated. Since the system LSI device, in particular, contains various circuits as set forth above, each circuit must be tested. Further, where usable semiconductor testers are different from some circuits under test or temperature conditions are changed for circuits under test, a plurality of test processes are indispensable.

Especially, since pins of the probe card are in contact with the pads several times during the test at the wafer stage, the pads are subjected to damage. That is, when the pins are in contact with the pads, surfaces of the pads made of metal are damaged. As a result, when wires are bonded to the pads of the LSI device and the inner leads of the package in the assembly stage, the wire bonding is unsuccessfully carried out for the heavily damaged pads so that poor quality LSI devices are produced. To avoid the production of such poor quality LSI devices, the pads are made larger in areas to reduce repeated contacts of pins of the probe card with the same points so that contacting points can be changed every time the pins are in contact with the pads. Alternatively, the pads are made larger in areas to accept repeated contacts of the pins with the pads so that bonding points at the assembly stage can be changed from contacting points at the wafer test stage. However, as the pads become larger in area, the LSI device also becomes undesirably larger (as shown in Japanese Patent Publication NO. 08-29451, for instance).

SUMMARY OF THE INVENTION

An embodiment in accordance with the present invention is directed to a semiconductor device provided with a test-subject circuit including first pads and a test-irrelevant circuit including second pads. Each of the first pads has multiple divided pad portions while each pad of the second pads has a single pad portion.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings, wherein.

DETAILED DESCRIPTION OF THE INVENTION

Figure 1:
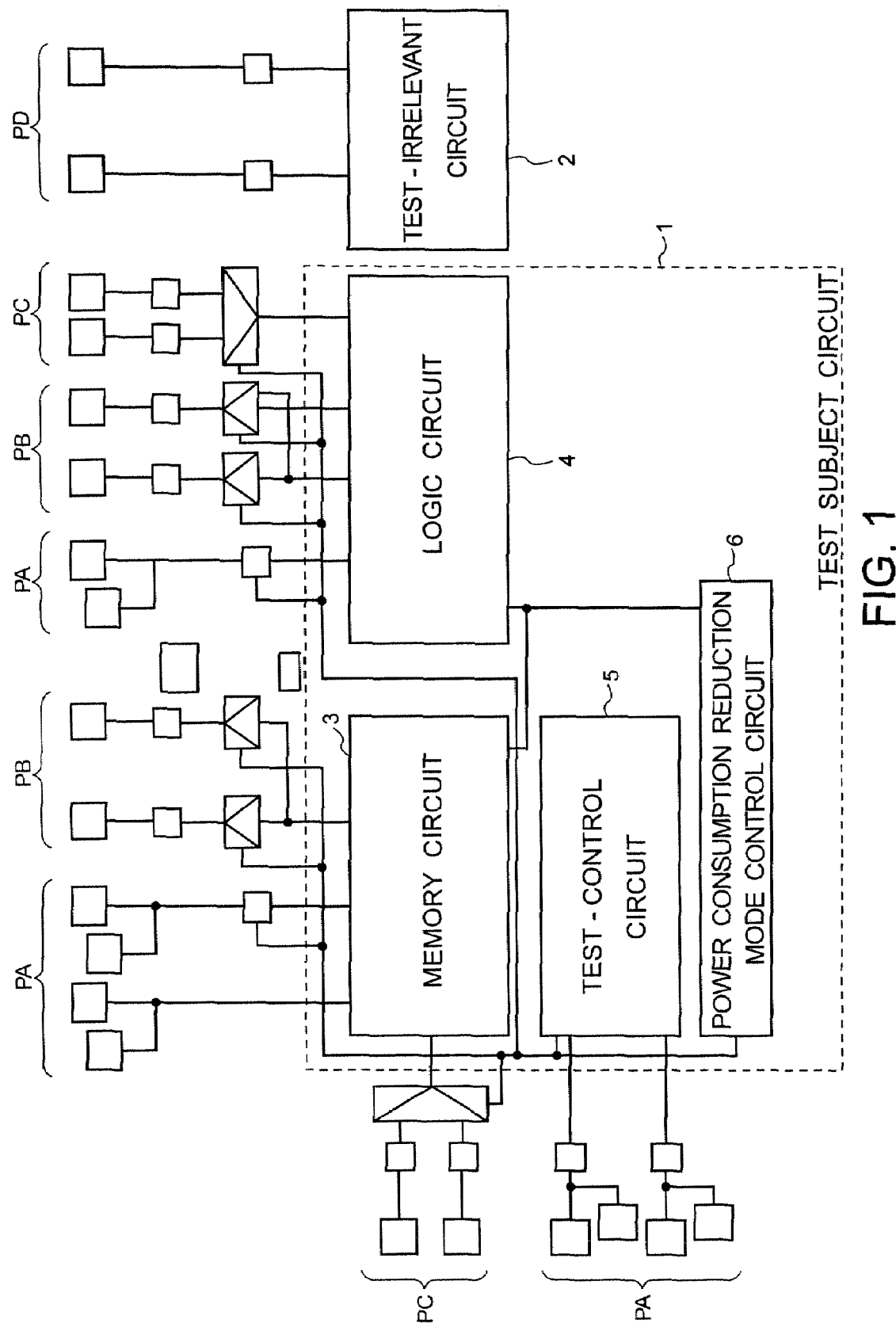
FIG. 1 is a block diagram of a semiconductor device in accordance with an embodiment of the present invention.

Embodiments of the present invention will be explained below with reference to the attached drawings. It should be noted that the present invention is not limited to the embodiments but covers their equivalents. Throughout the attached drawings, similar or same reference numerals show similar, equivalent or same components. The drawings, however, are shown schematically for the purpose of explanation so that their components are not necessarily the same in shape or dimension as actual ones. In other words, concrete shapes or dimensions of the components should be considered as described in these specifications, not in view of the ones shown in the drawings. Further, some components shown in the drawings may be different in dimension or ratio from each other.

EMBODIMENT

An embodiment of the present invention described below is an LSI device provided with logic circuits and memories such as a ROM (read only memory) and a RAM (random access memory) by way of example. The present invention is not limited to such an embodiment but is also applicable to a semiconductor device subjected to repeated wafer tests.

FIG. 1 is a block diagram of a semiconductor device in accordance with an embodiment of the present invention. The semiconductor device comprises test-subject circuit 1 and test-irrelevant circuit 2. Test-subject circuit 1 includes memory circuit 3, logic circuit 4, test control circuit 5 and power-consumption-reduction mode control circuit 6, etc. and pads PA, PB, PC and PD disposed in circumferences of the LSI device with which pins of probe card (not shown) are in contact for wafer test. Although the pads in this embodiment are disposed in the circumferences of the LSI device, the pads may also be formed inside of the LSI device.

Here, power-consumption-reduction mode control circuit 6 is provided to reduce power consumption of test-subject circuit 1. Various test modes are available but each test mode controls different circuits in test-subject circuit 1. Thus, when some circuits in test-subject circuit 1 are not subjected to test in response to certain test modes, it is unnecessary to supply power to the circuits. The power-consumption-reduction mode selectively covers modes called a stand-by mode, an idle mode, a halt mode, a stop mode, etc., which stop operations to reduce power consumption and the other modes which change supplied clocks to lower frequency to reduce power consumption.

There are some input pads PC, output pads PB and input-output pads PA on the LSI device. Input pad PC is provided to exclusively receive signals from outside devices while output pad PB is provided to exclusively supply signals to outside devices. Input-output pad PA can be switched from an input state to an output state in response to predetermined signals. The predetermined signals are control signals to make output terminals high-impedance in the case that the input-output pad is used for buffer cells provided with output enable functions (i.e., tri-state buffer cells). The predetermined signals, however, are output data signals in the case of open-drain-output cells. For example, in the case of n-channel open-drain output cells, the output data signals are set to 1's when the pad is used for the input.

Memory circuit 3 includes a plurality of memories, such as ROM (e.g., masked ROM and/or flash) and RAM (e.g., static RAM and/or dynamic RAM). Usually, memories are subjected to a number of tests that include initial tests (write and read tests for flash and RAM while read tests for masked ROM) several times at different temperatures and additional tests several times at different temperatures again after redundancy and repair processes based on results of the initial tests. Those repeated tests cause the pad portions to be severely damaged because pins of the probe card are in contact several times with the same points.

According to the embodiment, multiple divided pad portions per pad are provided so that the pins of the probe card can be repeatedly got in contact with different pad portions of the pad while a single pad portion per pad is prepared for the other pads which do not require for such manipulation. Thus, multiply divided pad portions are not provided for all the pads, so that the LSI device does not become large in size.

More concretely, pads used for memory and logic tests, power supply pads for memory circuit 3 and logic circuit 4 and the like are provided with multiply divided pad portions.

Figure 2:
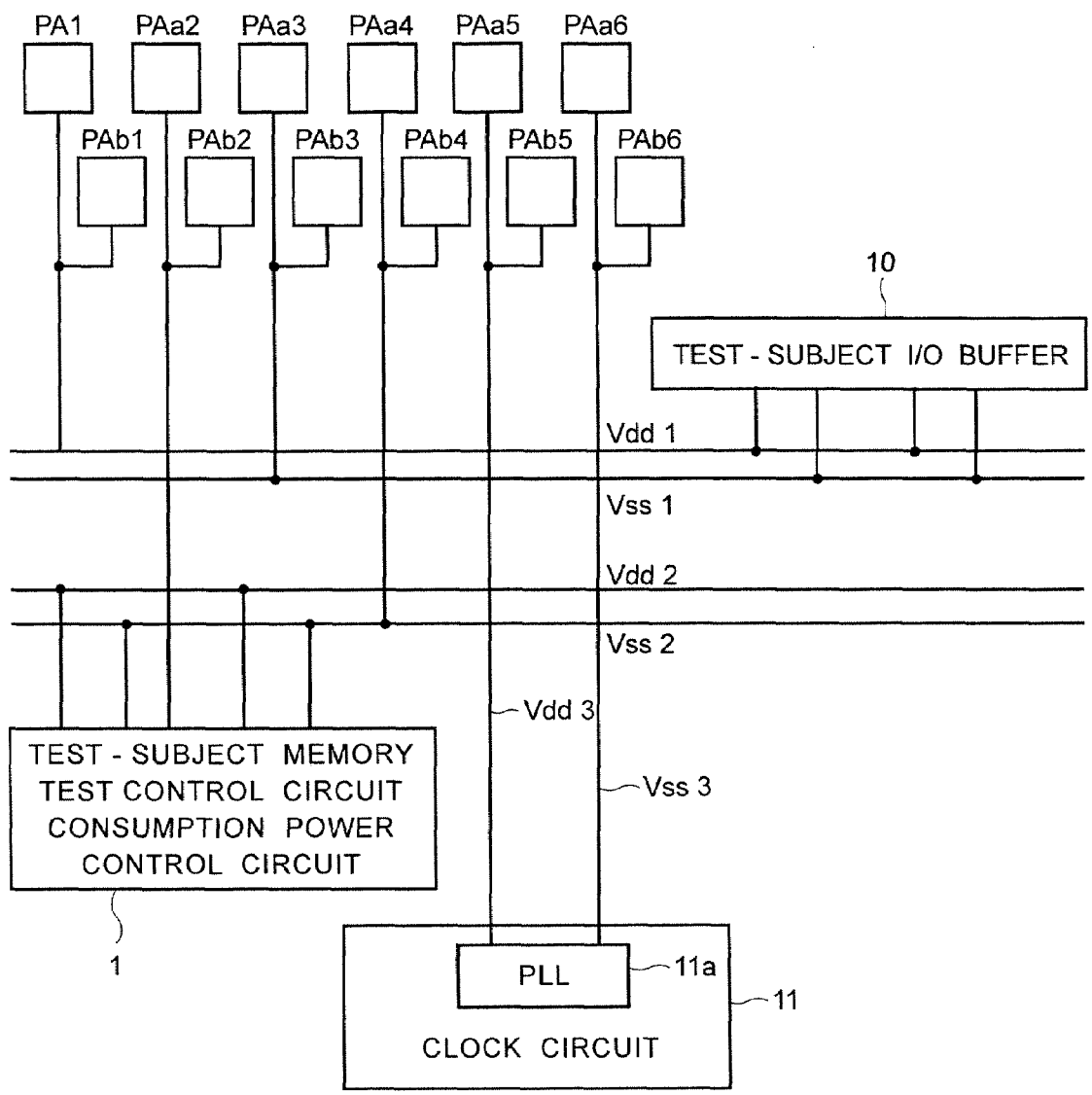
FIG. 2 is a block diagram of power source pads and test-subject circuits in accordance with the embodiment of the present invention.

FIG. 2 is a block diagram to show an example of connections arranged between power source pads and test-subject circuits. Since power consumption of every test-subject circuit is different from each other, necessary power source pads are disposed to supply the test-subject circuits circuit with power source voltages, respectively. Power supply pad portions PAa1-PAb6 have two branch pad portions per power source. Test-irrelevant circuit 2 not shown in FIG. 2 has a single pad portion per power source in the same manner as in prior art semiconductor devices. Power source voltages Vdd1, Vss1, Vdd2 and Vss2 are supplied to test-subject circuits (memory and logic circuits), a test control circuit and a power consumption reduction mode control circuit 6 in test-subject circuit 1, and test-subject input-output buffer circuit 10, respectively. Power source voltages Vdd3 and Vss3 are supplied to phase locked loop (PLL) 11a, etc. in clock circuit 11. It should be noted, however, PLL 11a is not always provided.

Figure 3:
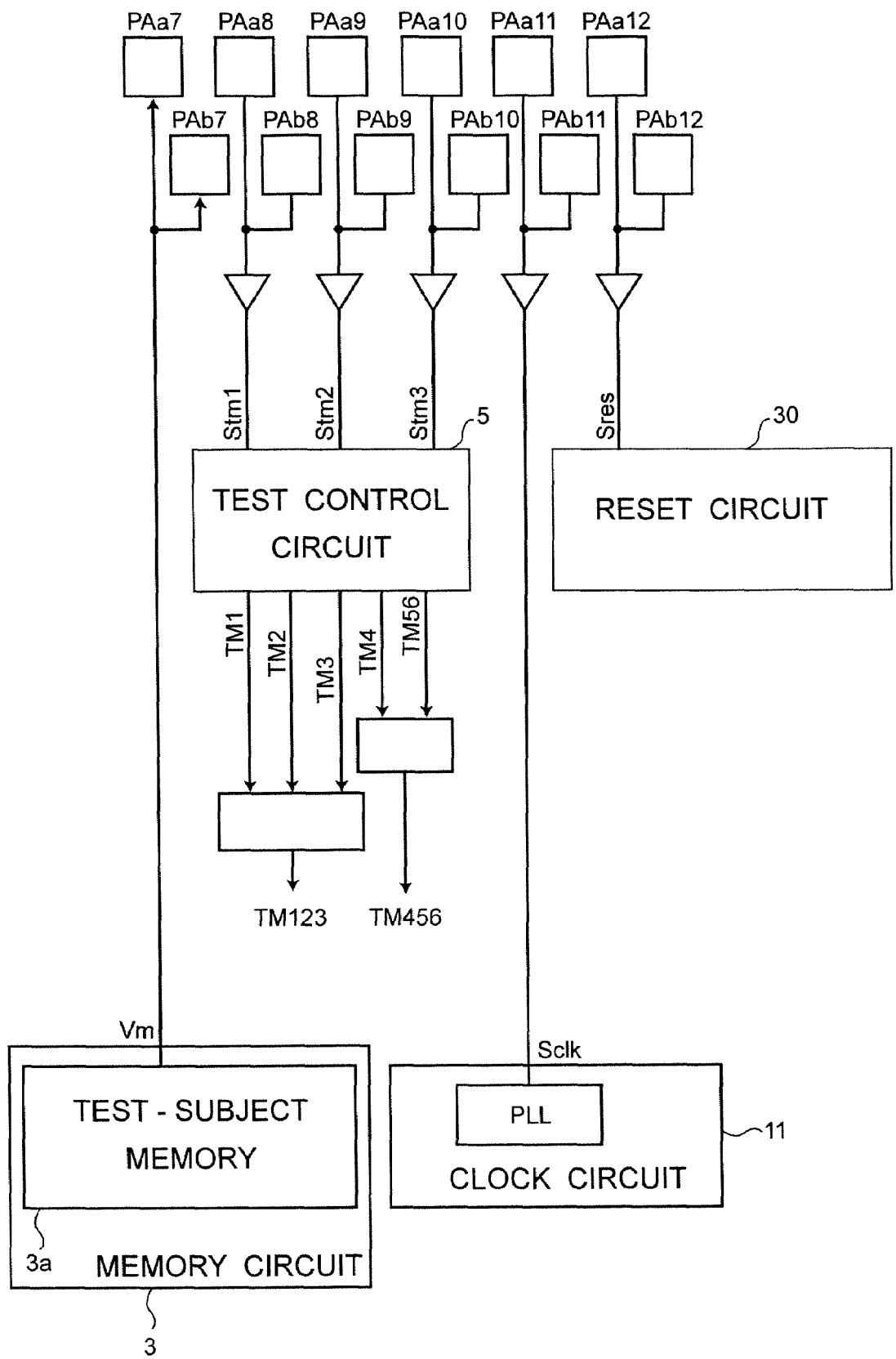
FIG. 3 is a block diagram of test pads and test-subject circuits in accordance with the embodiment of the present invention.

FIG. 3 is a block diagram to show an example of connections arranged between pads exclusively used for testing and test circuits. Since a variety of circuits are provided and a plurality of test modes are prepared for the circuits, each circuit is subjected to testing on its own test mode. Test control circuit 5 selects such test modes. Test control circuit 5 receives test mode selection signals Stm1, Stm2 and Stm3 from multiple divided pad portions PAa8, PAb8, PAa9, PAb9, PAa10, PAb10 and forms test mode signals TM1-TM4 and TM56. OR gates carries out logical OR operations for test mode signals TM1-TM3 and test mode signals TM4 and TM56 to create composite test mode signals TM123 and TM456, respectively. Those test mode signals are supplied to compulsorily set test-subject circuit 1 to test enable or test disable states. Reset circuit 30 receives reset signal Sres while PLL 11a of clock circuit 11 receives clock signal Sclk.

Since test mode selection signals Stm1-Stm3, reset signal Sres and clock signal Sclk are necessarily used for various tests, pad portions PAa7, PAb7, PAa8, PAb8, PAa9, PAb9, PAa10, PAb10, PAa11, PAb11, PAa12, PAb12 assigned to those signals are in contact with probe pins for such tests. Thus, two-branch pad portions PAa7, PAb7, PAa8, PAb8, PAa9, PAb9, PAa10, PAb10, PAa11, PAb11, PAa12, PAb12 are prepared for each signal. In the case, however, that clock signal is not supplied from an outside tester and that test-subject circuits are driven by an internal clock signal of an internal clock generator such as a ring oscillator, since probe pins are not always repeatedly in contact with some pad portions to supply such clock signal, single pad portions may be prepared for those arrangements. Alternatively, where a pad portion is not usually used to receive a clock signal but such a pad portion in place of pad portion PAa11 or PAb11 receives the clock signal at a test time only, pad portion PAa11 or PAb11 is unnecessary. For instance, pad portion PAa11 or PAb11 is unnecessary in the case that one of the pad portions connected to the test-subject circuit is supplied with a base clock signal from the tester and a clock signal generated by the division or multiplication of the base clock signal can be supplied to clock circuit 11 as a substituted one of clock signal Sclk.

Further, output signal Vm is the one that is used to monitor an output signal of test-subject memory 3a of memory circuit 3. Output signal Vm is supplied to multiple divided pad portions PAa7 and PAb7 or single pad portions. Potential monitor signals of other circuits than the memory, e.g., analog circuits, can be also supplied to multiple divided pad portions. Needless to say, however, no such multiple divided pad portions are provided in the case that multiple monitor tests are not required.

Figure 4:
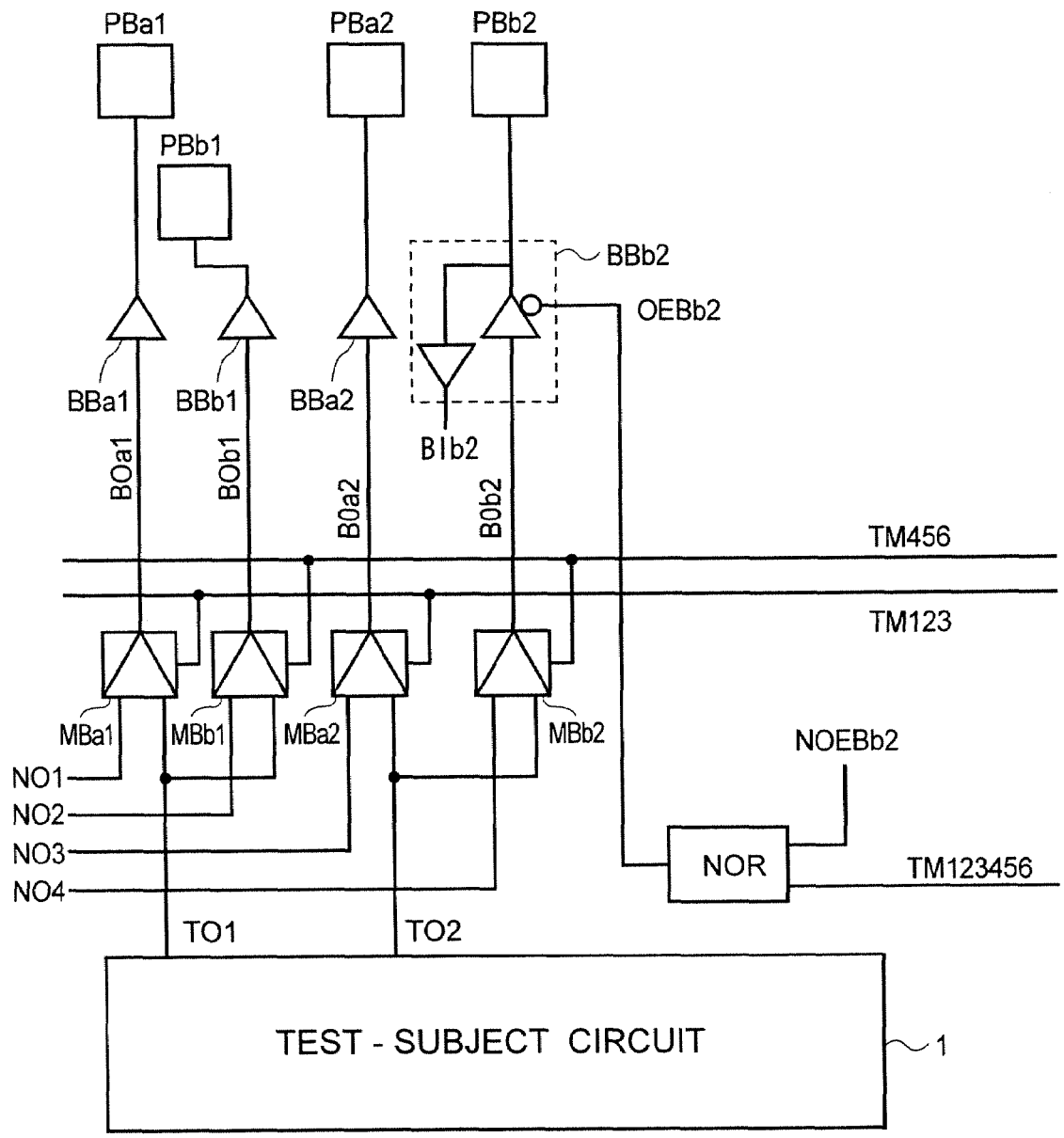
FIG. 4 is a block diagram of test output pads and test-subject circuits in accordance with the embodiment of the present invention.

FIG. 4 is a block diagram to show an example of connections arranged between output pads and test circuits. Two pad portions per output signal can be assigned to transmit output signals of test-subject circuit 1. Output signal TO1, for instance, is supplied to either pad portion PBa1 through selection circuit MBa1 and buffer cell BBa1 or pad portion PBb1 through selection circuit MBb1 and buffer cell BBb1. It can be determined in response to test mode signal TM123 and/or TM456 whether output signal TO1 is supplied from pad portion PBa1 and/or PBb1. Thus, when a test is carried out in response to test mode signal TM123, output signal TO1 is supplied to pad portion PBa1, so that a probe pin can be in contact with pad portion PBa1, only. In this case, since no pin needs to be in contact with pad portion PBb1, the number of times at which the probe pins are in contact with the pad portions can be reduced.

At a normal operation mode, both test mode signals TM123 and TM456 become "1" and output signals NO1 and NO2 from the inside of the LSI device are selected and supplied to pad portions PBa1 and PBb1, respectively.

Output signal TO2 is also supplied to selection circuits MBa2 and MBb2 and is transmitted to pad portions PBa2 and PBb2 through buffer cells BBa2 and BBb2 in response to test signals TM123 and TM456, respectively. Output buffer cells BBa1, BBb1 and BBa2 are interposed between pad portions PBa1, PBb1 and PBa2 and selection circuits MBa1, MBb1 and MBa2, respectively. Input and output buffer cell BBb2 is interposed between pad portion PBb2 and selection circuit MBb2. In order to make pad portion PBb2 exclusively operate as an output pad on the test mode, a control terminal of input and output buffer cell BBb2 receives inversed output signal OEBb2 from an NOR gate to which normal output enable signal NOEBb2 and test mode signal TM123456 are applied. The NOR gate always outputs a "0" signal in response to normal output enable signal NOEBb2 and test mode signal TM123456 in the test mode, so that pad portion PBb2 can be in an output state. Selection circuits MBa2 and MBb2 also receive output selection signals NO3 and NO4 from the inside of the LSI device, respectively.

Figure 5:
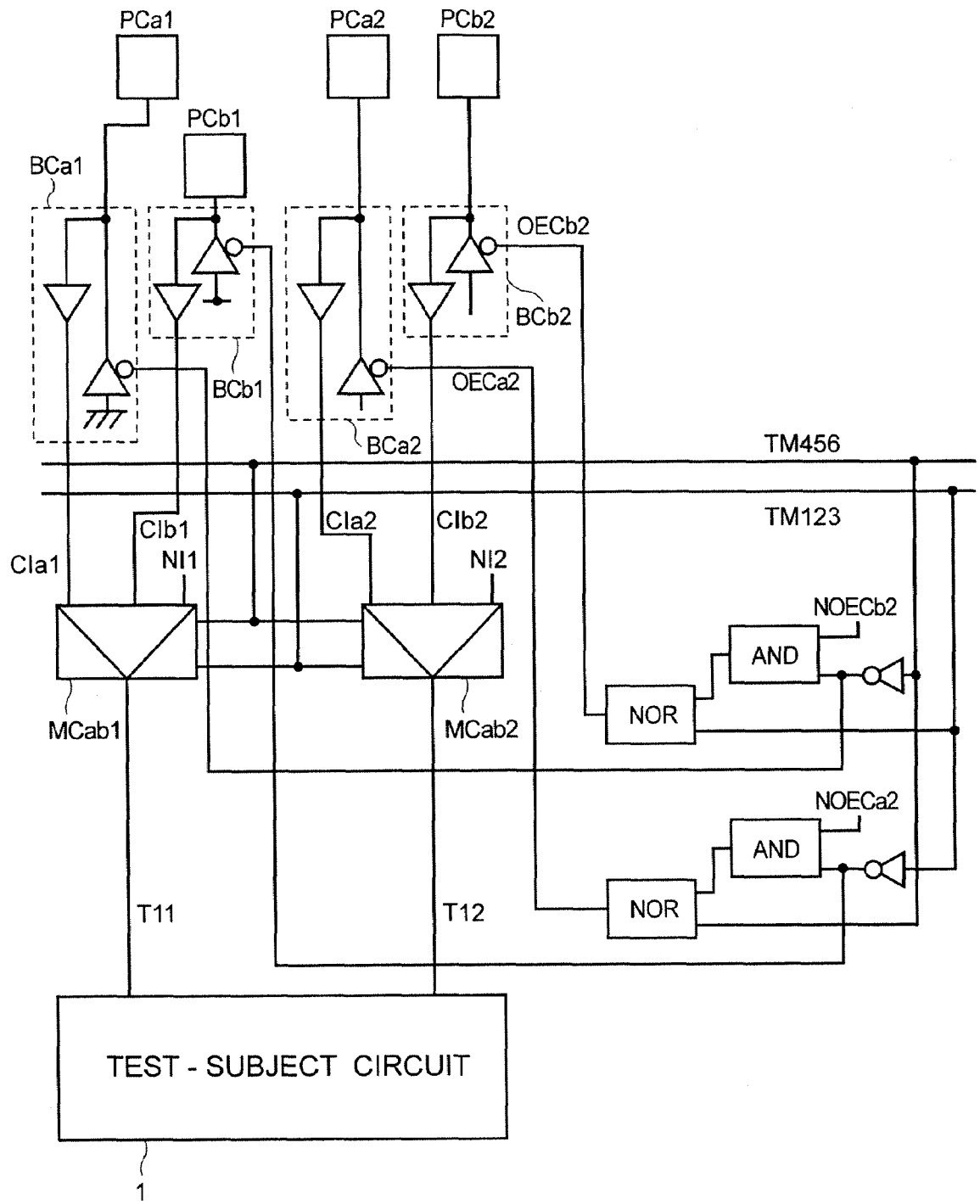
FIG. 5 is a block diagram of test input pads and test-subject circuits in accordance with the embodiment of the present invention.

FIG. 5 is a block diagram to show an example of connections arranged between test input pad portions and test circuits. Two pad portions per input signal are assigned to test-subject circuit 1. Input signals supplied to pad portions PCa1 and PCb1 are transmitted to selection circuit MCab1 through buffer cells BCa1 and BCb1, respectively. Selection circuit MCab1 supplies output signal TI1 to test-subject circuit 1. Test mode signals TM123 and TM456 can determine whether input signal TI1 to test-subject circuit 1 is the one corresponding to the input signal applied to pad portion PCa1 or PCb1. When a test is carried out in response to test mode signal TM123, input signal TI1 corresponds to the one applied to pad portion PCa1. Thus, a probe pin is kept in contact with pad portion PCa1, only, but no probe pin needs to be in contact with pad portion PCb1. On the other hand, when another test is carried out in response to test mode signal TM456, input signal TI1 corresponds to the one applied to pad portion PCb1. Thus, a probe pin is kept in contact with pad portion PCb1, only, but no probe pin needs to be in contact with pad portion PCa1. Therefore, input pads can be changed for every test mode, so that the number of contacts per pad portion can be significantly reduced.

Further, an input terminal of selection circuit MCab1 receives internal signal NI1 of the LSI device. When both test mode signals TM123 and TM456 are set to a "1" signal on the normal operation, internal signal NI1 is selectively applied to test-subject circuit 1 through selection circuit MCab1.

Pad portions used for test input pads are connected to input or input-output buffer circuits. Pad portions PCa1 and PCb1 are connected to input-output buffer cells. When a test is carried out, either pad portion PCa1 or PCb1 is kept in contact with a probe pin. As a result, a pad portion with which no probe pin is in contact becomes a floating state. To avoid such a floating state, when a probe pin is in contact with pad portion PCa1, test mode signals TM123 and TM456 are set to "1" and "0" signals, respectively. Since test mode signal TM456 is inverted by an inverter and then is applied to a control terminal of input-output buffer cell BCa1, input-output buffer cell BCa1 becomes an input state so that a test input signal applied to pad portion PCa1 corresponds to input signal TI1 of test-subject circuit 1. On the other hand, since test mode signal TM123 is inverted by an inverter and then is applied to a control terminal of input-output buffer cell BCb1, input-output buffer cell BCb1 becomes an output state, so that pad portion PCb1 is fixed at a high level. This arrangement of input-output buffer cells can prevent pad portions with which no probe pins are in contact from becoming the floating state.

Input signals applied to pad portions PCa2 and PCb2 can be transmitted to input terminals CIa2 and CIb2 of selection circuit MCab2 through buffer cells BCa2 and BCb2, respectively. Pad portions PCa2 and PCb2 are different in operations from pad portions PCa1 and PCb1 in which buffer cells BCa2 and BCb2 operate as input-output buffer cells at normal operations. When pad portion PCa2 is in contact with a probe pin, test mode signals TM123 and TM456 are set to "1" and "0" signals, respectively. Normal output enable control signals NOECb2 and NOECa2 are always set to "0" signals at test modes. Thus, control signal OECa2 equal to a "1" is applied to a control terminal of input-output buffer cell BCa2, so that pad portion PCa2 becomes an input state and input signal TI2 is the one corresponding to an input signal applied to pad portion PCa2. On the other hand, control signal OECb2 equal to a "0" is applied to a control terminal of input-output buffer cell BCb2, so that pad portion PCb2 becomes an input state and is prevented from a floating state. In this way, when no probe pin is contact with pad portion PCa2, no floating state occurs at pad portion PCa2.

Figure 6:
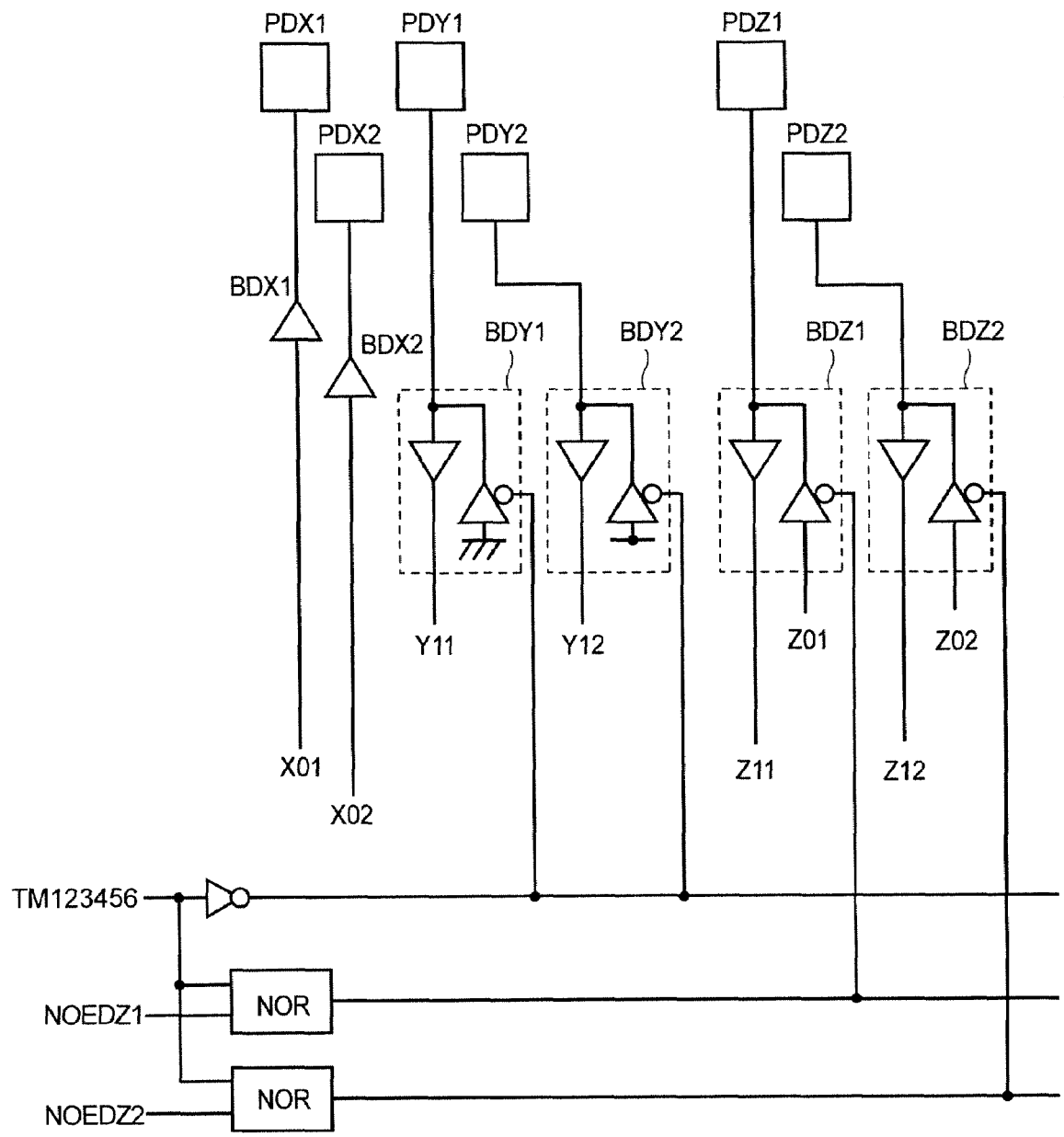
FIG. 6 is a block diagram of pads connected to a test-irrelevant circuit in accordance with the embodiment of the present invention.

FIG. 6 is a block diagram to show an example of connections arranged between test-irrelevant circuit 2 and pad portions. Here, the test irrelevant circuit is the one that is subjected to no tests at the wafer stage or that does not require multiple tests at the wafer stage but a test at the assembly stage as the case may be. The pad potions for the test-irrelevant circuit 2 include input, output and input-output pad portions.

Pad portions PDX1-PDZ2 connected directly or indirectly to test-irrelevant pad portions are not related to tests. No test pattern signals are applied to pad portions PDY1-PDZ2 or any test results are not supplied from pad portions PDX1-PDX2 and PDZ1-PDZ2. That is, pad portions PDX1-PDZ2 are irrelevant to tests and need to connect no probe pins. Thus, it is unnecessary to divide each pad into a plurality of pad portions.

When input pad portions are set to floating states, some circuits may be affected. Thus, input pad portions are set to pulled-up or pulled-down states while input-output pad portions need to be an output state. Here, since output buffer cells BDX1, BDX2, input-output buffer cells BDY1-BDZ2, an inverter, and NOR gates shown in FIG. 6 are substantially the same in operation as those set forth above, detailed descriptions about those components are omitted. It is important to note that the input-output buffer cells are provided to avoid floating state at the input because no probe pins are in contact with the input.

As described above in detail, since pads with which probe pins are repeatedly kept in contact are divided into multiple pad portions while pads with which the number of contacts by probe pins are few are made of single pad portions in the same manner as in conventional semiconductor devices, damage of the pad portions can be avoided and LSI devices can be prevented from their area increasing.

Each of the pads of the embodiments is divided into two pad portions but the same can be divided into three pad portions or more.

Further, pads subjected to repeated contacts with probe pins can increase in area to avoid the damage instead of dividing each pad into a plurality of pad portions.

In addition, test-subject circuit 1 includes not only memory and logic circuits but also the other circuits that need tests.

In the foregoing description, certain terms have been used for brevity, clearness and understanding, but no unnecessary limitations are to be implied therefrom beyond the requirements of the prior art, because such words are used for descriptive purposes herein and are intended to be broadly construed. Moreover, the embodiments of the improved construction illustrated and described herein are by way of example, and the scope of the invention is not limited to the exact details of construction. Having now described the invention, the construction, the operation and use of embodiments thereof, and the advantageous new and useful results obtained thereby, the new and useful construction, and reasonable equivalents thereof obvious to those skilled in the art, are set forth in the appended claims.

What is claimed is:

1. A semiconductor device comprising:
    a test-subject circuit;
    a test-irrelevant circuit;
    first pads used for the test-subject circuit, each of the first pads including a plurality of pad portions;
    second pads used for the test-irrelevant circuit, each of the second pads being provided with a single pad portion;
    third pads to provide test selection signals, each of the third pads including a plurality of pad portions;
    a test control circuit connected to the third pads, the test control circuit receiving the test mode selection signals to obtain test mode signals; and
    selection circuits to connect the test-subject circuit to the pad portions of the first pads selectively in response to the test mode signals.

2. A semiconductor device according to claim 1, wherein the first pads include at least input-output pads provided with a plurality of pad portions.

3. A semiconductor device according to claim 1, wherein each of the selection circuits provides an output signal of a normal operation mode and an output signal of a test mode selectively to each of the plurality of pad portions of the first pads, the output signal of the test mode being output from the test-subject circuit.

4. A semiconductor device according to claim 3, wherein buffer cells are respectively connected between the selection circuits and the pad portions of the first pads.

5. A semiconductor device according to claim 4, wherein one of the buffer cells is an input-output buffer cell, the input-output buffer cell being capable of controlling output to one of the pad portions of the first pads in response to the normal output enable signal and the test mode signals.

6. A semiconductor device according to claim 1, wherein the selection circuits provide input signals input from the plurality of pad portions of the first pads to the test-subject circuit selectively.

7. A semiconductor device according to claim 6, wherein buffer cells are respectively connected between the selection circuits and the pad portions of the first pads.

8. A semiconductor device according to claim 7, wherein the buffer cells are input-output buffer cells, the input-output buffer cells being capable of controlling output to the pad portions of the first pads in response to the test mode signals.

9. A semiconductor device according to claim 7, wherein the buffer cells are input-output buffer cells, the input-output buffer cells being capable of controlling output to the pad portions of the first pads in response to the test mode signals and a normal output enable signal.

10. A semiconductor device according to claim 1, wherein the test-subject circuit includes at least one of a memory circuit or a logic circuit.

* * * * *